United States Patent
Honda et al.

(10) Patent No.: US 8,795,478 B2
(45) Date of Patent: Aug. 5, 2014

(54) METHOD FOR MANUFACTURING PERPENDICULAR MAGNETIC RECORDING MEDIUM

(75) Inventors: Yoshinori Honda, Kanagawa-ken (JP);
Takayuki Ichihara, Tokyo (JP);
Hiroyuki Nakagawa, Kanagawa (JP);
Kiwamu Tanahashi, Tokyo (JP)

(73) Assignee: HGST Netherlands B.V., Amsterdam (NL)

( * ) Notice: Subject to any disclaimer, the term of this patent is extended or adjusted under 35 U.S.C. 154(b) by 1974 days.

(21) Appl. No.: 11/253,431

(22) Filed: Oct. 18, 2005

(65) Prior Publication Data

US 2006/0086606 A1    Apr. 27, 2006

(30) Foreign Application Priority Data

Oct. 21, 2004   (JP) ................................. 2004-306378

(51) Int. Cl.
| | | |
|---|---|---|
| *C23C 14/00* | (2006.01) | |
| *C23C 14/32* | (2006.01) | |
| *G11B 5/66* | (2006.01) | |
| *C23C 14/06* | (2006.01) | |
| *G11B 5/851* | (2006.01) | |
| *H01J 37/34* | (2006.01) | |
| *C23C 14/34* | (2006.01) | |
| *G11B 5/73* | (2006.01) | |
| *G11B 5/65* | (2006.01) | |
| *G11B 5/667* | (2006.01) | |

(52) U.S. Cl.
CPC .............. *G11B 5/851* (2013.01); *G11B 5/7325* (2013.01); *C23C 14/0688* (2013.01); *G11B 5/65* (2013.01); *H01J 37/34* (2013.01); *G11B 5/667* (2013.01); *C23C 14/3492* (2013.01); *H01J 37/34262* (2013.01); *C23C 14/345* (2013.01)

USPC .............. 204/192.2; 204/192.12; 204/192.13; 428/827; 428/828

(58) Field of Classification Search
USPC ............... 204/192.2, 192.12, 192.13, 298.08; 428/611, 827, 828
See application file for complete search history.

(56) References Cited

U.S. PATENT DOCUMENTS 5,584,974 A * 12/1996 Sellers ...................... 204/192.13
5,807,467 A *  9/1998 Givens et al. ............ 204/192.12

(Continued)

FOREIGN PATENT DOCUMENTS

JP       62217419 A *  9/1987
JP       04129020 A *  4/1992

(Continued)

*Primary Examiner* — Michael Band
(74) *Attorney, Agent, or Firm* — Zilka-Kotab, PC

(57) ABSTRACT

Embodiments of the invention provide a manufacturing method which permits a high quality perpendicular magnetic recording medium to be manufactured with a high yield by preventing abnormal discharge which sputters particles from the target. In one embodiment, while the perpendicular magnetic recording medium is formed, DC pulses are applied to the target. During the reversal period (Reversal Time) between sputtering periods, a voltage of the opposite polarity is applied. During the sputtering period, a negative voltage is applied which biases the target surface to a negative potential, causing Ar+ to collide with and sputter CoCrPt and $SiO_2$ for deposition on the intermediate layer. The top surface of the insulation material ($SiO_2$) on the target is charged by Ar+ to have a voltage larger than the target voltage. However, arcing can be prevented since the charge on the surface of the insulation material is neutralized due to a positive voltage applied to the target during the non-sputtering period.

20 Claims, 7 Drawing Sheets

(56) References Cited

U.S. PATENT DOCUMENTS

| | | | |
|---|---|---|---|
| 5,993,613 A * | 11/1999 | Manley | 204/192.12 |
| 6,019,876 A * | 2/2000 | Goedicke et al. | 204/192.2 |
| 6,869,688 B2 * | 3/2005 | Usuki | 428/611 |
| 7,393,601 B1 * | 7/2008 | Chen et al. | 428/828 |
| 7,504,166 B2 * | 3/2009 | Chen et al. | 428/827 |
| 2003/0099868 A1 * | 5/2003 | Tanahashi et al. | 428/694 TM |

FOREIGN PATENT DOCUMENTS

| | | | |
|---|---|---|---|
| JP | 05109044 A | * | 4/1993 |
| JP | 08-053760 | | 2/1996 |
| JP | 11012730 A | * | 1/1999 |
| JP | 2002342909 A | * | 11/2002 |
| JP | 2003-323709 | | 11/2003 |
| JP | 2004220737 A | * | 8/2004 |

* cited by examiner

Ra:0.323
Rp:1.900
Rmax:3.507

Ra:0.474
Rp:3.527
Rmax:6.432

This application claims priority from Japanese Patent Application No. JP2004-306378, filed Oct. 21, 2004, the entire disclosure of which is incorporated herein by reference.

METHOD FOR MANUFACTURING PERPENDICULAR MAGNETIC RECORDING MEDIUM

CROSS-REFERENCES TO RELATED APPLICATIONS

This application claims priority from Japanese Patent Application No. JP2004-306378, filed Oct. 21, 2004, the entire disclosure of which is incorporated herein by reference.

BACKGROUND OF THE INVENTION

The present invention relates to a method for manufacturing a perpendicular magnetic recording medium. In particular, the invention relates to a method for forming a recording layer of a perpendicular magnetic recording medium.

Recently, due to demands for higher recording densities, magnetic recording media, in particular, magnetic disks for magnetic hard disk drives (HDDs) are showing rapid improvement in coercivity. CoCrPt-based ferromagnetic alloys, which are conventionally used to form magnetic layers on magnetic disks, have reached the limit of coercivity and become difficult to meet the recent demand for higher coercivity. In addition, the conventional longitudinal recording method involves the problem of thermal stability, creating a demand for better thermal stability characteristics. Thermal stability is a phenomenon which causes a signal, recorded on a magnetic recording medium, to begin decaying after a certain period. Finally, the recorded signal decays down to the noise level of the medium, making it impossible to retrieve the recorded signal. This is a result of making smaller magnetic grains in order to secure high S/N for high recording densities these days. Accordingly, replacing longitudinal magnetic recording by perpendicular magnetic recording is being considered in order to solve these problems.

In a high recording density area, perpendicular magnetic recording is highlighted as a method capable of attaining sufficiently high S/N ratio while securing good thermal stability. A perpendicular magnetic recording medium includes: a perpendicular magnetic recording layer composed of a perpendicular magnetization film to record an information signal; a soft magnetic under layer to raise the information signal read/write efficiency; and an intermediate layer lying between the perpendicular magnetic recording layer and the soft magnetic under layer to improve the crystalline structure of the perpendicular magnetic recording layer and control the crystal grain size. It is essential that a perpendicular magnetic recording layer with good magnetic properties can be formed stably. Therefore, studies of granular magnetic films are in progress. A granular magnetic film is a recording layer composed of a CoCrPt-based alloy having such an insulator as $SiO_2$ added. To form a perpendicular magnetic recording layer, RF (Radio Frequency) sputtering is mainly used. Patent Document 1 (Japanese Patent Laid-Open No. 2003-323709) discloses a sputtering method which uses a direct current pulsed voltage.

BRIEF SUMMARY OF THE INVENTION

In terms of mass production, RF sputtering is inferior to DC sputtering since in particular the sputtering efficiency is much lower than that of the DC sputtering. For RF sputtering, it is difficult to raise the film forming speed for higher productivity. RF sputtering is also inferior in terms of repeatability. In the direct current pulsed sputtering method disclosed in Patent Document 1, since the target voltage is between 0 V and −XV during formation of a granular medium, the insulation material on the target surface is biased to a negative potential and cannot be released from the negative potential. Thus, the insulation material may have insulation breakdown which causes large abnormal discharge (arcing). If arcing occurs, particles are scattered and stick to the medium, making it impossible to improve the quality of the medium and raise the yield ratio.

It is a feature of the present invention to provide a method capable of manufacturing a high quality perpendicular magnetic recording medium at a high yield ratio by preventing the target from sputtering particles by abnormal discharge.

A perpendicular magnetic recording medium manufacturing method according to an aspect of the present invention includes: preparing a substrate; forming an adhesion layer, a magnetic domain pinning layer, a soft magnetic under layer and an intermediate layer on the substrate; forming a perpendicular magnetic recording layer on the intermediate layer by performing DC pulse sputtering wherein a negative voltage is applied to a target made of magnetic material mixed with insulation material during the sputtering period and a positive voltage is applied to the target during the non-sputtering period; forming a protective layer on the perpendicular magnetic recording layer; and forming a lubricant layer on the protective layer.

In some embodiments, the DC pulse sputtering is such that the pulse frequency is 20 kHz to 150 kHz and the non-sputtering period is 2 μsec to 7 μsec. The DC pulse sputtering is such that the voltage applied to the target during the non-sputtering period is +15 V to +80 V. The target is made of CoCrPt alloy mixed with $SiO_2$.

Preferably, the substrate is a glass substrate, a ceramic substrate or an aluminum substrate plated with NiP. The adhesion layer, the magnetic domain pinning layer, the soft magnetic under layer and the intermediate layer are formed by DC sputtering. The magnetic domain pinning layer is formed by laminating a crystallographic orientation control layer, an antiferromagnetic layer and a magnetic domain pinning enhance layer in this order. The soft magnetic under layer is formed by laminating a high saturation magnetic flux density layer, a nonmagnetic layer and a high saturation magnetic flux density layer. The intermediate layer is formed by laminating a precoat layer and a crystallographic orientation control layer.

In accordance with another aspect of the invention a perpendicular magnetic recording medium manufacturing method includes: preparing a substrate; forming an adhesion layer, a magnetic domain pinning layer, a soft magnetic under layer and an intermediate layer on the substrate; forming a perpendicular magnetic recording layer on the intermediate layer by performing DC pulse sputtering wherein a bias voltage is applied to the substrate, a negative voltage is applied to a target made of magnetic material mixed with insulation material during the sputtering period and a positive voltage is applied to the target during the non-sputtering period; forming a protective layer on the perpendicular magnetic recording layer; and forming a lubricant layer on the protective layer.

According to the present invention, it is possible to manufacture a high quality perpendicular magnetic recording medium at a high yield ratio since abnormal discharge which would sputter particles from the target can be prevented.

DETAILED DESCRIPTION OF THE INVENTION

The present invention is characterized in that in DC pulsed sputtering for a perpendicular magnetic recording medium, the target surface is kept at a negative potential during sputtering but kept at a positive potential during the non-sputtering period. This enables arcing-free high efficiency sputtering since the insulation surface is always neutralized in charge.

Figure 2:
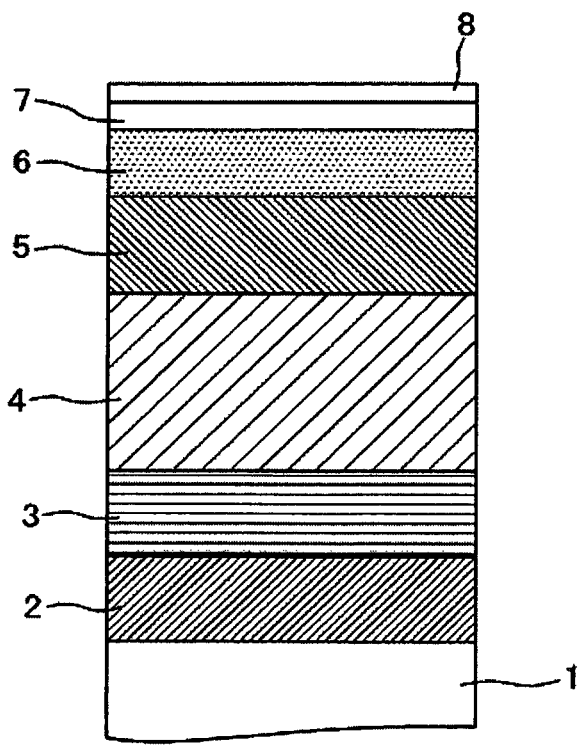
FIGS. 2-2A show cross-sectional views of a perpendicular magnetic recording disks fabricated by a perpendicular magnetic recording medium manufacturing method, according to several implementations of the present invention.

FIG. 2 shows the configuration of a perpendicular magnetic recording medium manufactured by a perpendicular magnetic recording medium manufacturing method, according to an implementation of the present invention. Since the perpendicular magnetic recording disk has the same layered medium structure formed on each side of a substrate 1, FIG. 2 shows only the structure on one side. The perpendicular magnetic recording disk includes the substrate 1, an adhesion layer 2 formed on the substrate 1, a magnetic domain pinning layer 3 formed on the adhesion layer 2, a soft magnetic under layer 4 formed on the magnetic domain pinning layer 3, an intermediate layer 5 formed on the soft magnetic under layer 4, a perpendicular magnetic recording layer 6 formed on the intermediate layer 5, a protective layer 7 coated on the perpendicular magnetic recording layer 6 and a lubricant layer 8 coated on the protective layer 7.

Figure 2A:
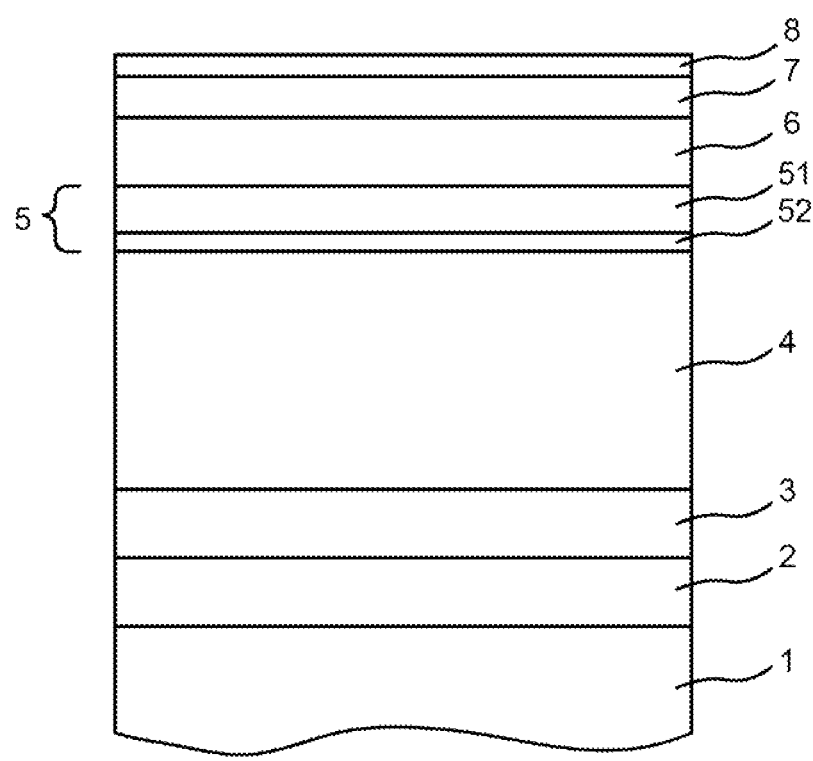

According to one embodiment, as shown in FIG. 2A, the intermediate layer 5 may be formed by laminating a precoat layer 52 and a crystallographic orientation control layer 51. In terms of stress to the laminated films, thermostability, flatness and smoothness, the substrate 1 is preferably a glass substrate, a ceramic substrate or an aluminum substrate plated with NiP. As for the surface roughness of the substrate 1, the central average roughness Ra is not larger than about 0.3 nm and the maximum projecting height Rmax is not larger than about 5 nm. This surface roughness can be attained by double-sided polish with diamond abrasive grains.

The adhesion layer 2 serves to mitigate stresses in the multiple layers laminated above and secure adhesion with the upper layers. Preferably, the adhesion layer 2 is made of a Ni-based alloy, a Co-based alloy or an Al-based alloy, namely NiTa, NiTaZr, NiAl, NiCr, CoTi, CoTa, AlTa or the like. This film is formed by DC sputtering.

The magnetic domain pinning layer 3 serves to pin magnetic domains in the soft magnetic under layer 4 and includes a crystallographic orientation control layer, an antiferromagnetic layer and a magnetic domain pinning enhance layer. The crystallographic orientation control layer is preferably made of NiFe, CoFe, CoCr or the like. The antiferromagnetic layer is preferably made of MnIr, FeMn or the like. The magnetic domain pinning enhance layer is preferably made of CoFe, NiFe, CoCr or the like. The magnetic domain pinning layer 3 is formed by DC sputtering.

The soft magnetic under layer 4 is required to have a high Bs characteristic so that the magnetic flux which goes out from the main pole of the magnetic head is returned to the return pole of the magnetic head with small magnetic resistance. Preferably, the soft magnetic under layer 4 is made of CoTaZr, CoNbZr, CoTaNb, CoFeB, NiFe, FeTaC, FeTaB, FeTaCuC, FeTaCu or the like. It is also possible to constitute an APC (Anti Parallel Coupling) structure by inserting a nonmagnetic layer made of Ru, Cu, C, RuCu or the like between the laminated soft magnetic films made of some of the materials mentioned above.

The intermediate layer 5 is a layer to control the perpendicular magnetic recording layer 6 in terms of the crystal grain size and crystallographic orientation. Its material is selectable from NiFe, Ta, W, Ru, RuCo, Cu, Ti, CoTi, AlTi and the like. This film is formed by DC sputtering.

As described later, the perpendicular magnetic recording layer 6 is obtained by performing DC sputtering with a $SiO_2$-contained CoCrPt target in $O_2$-added Ar gas atmosphere. This layer is a ferromagnetic layer which is composed mainly of CoCrPt and contains $SiO_2$.

The protective layer 7 is a carbon film. Preferably, this film is a DLC (Diamond Like Carbon) film formed by the CVD or IBD method.

Preferably, the lubricant layer 8 is a fluorine-based liquid lubricant.

The following describes a perpendicular magnetic recording disk manufacturing method, according to an implementation of the present invention. As the substrate 1, a 65 mm-diameter glass substrate was prepared with a central average roughness Ra of about 0.3 nm. The substrate 1 was set in a DC sputtering apparatus. A 30 nm-thick adhesion layer 2 was formed by using a Ni40Ta target in Ar gas atmosphere at 1.25 Pa. DC500 W was applied to the DC magnetron cathode (target).

Then, as a magnetic domain pinning layer 3, Ni20Fe, Mn20Ir and Co30Fe were deposited in this order. They were grown to thicknesses of 10 nm, 20 nm and 5 nm, respectively. During deposition, the Ar gas pressure was fixed at 1 Pa whereas the power applied to the DC magnetron cathode was changed: DC500 W, 1 kW and 300 W.

Then, as a soft magnetic under layer 4, an anti-parallel coupling soft magnetic under layer was formed by sputtering a 100 nm-thick Co10Ta5Zr film, a 1 nm-thick Ru film and a 100 nm-thick Co10Ta5Zr film in this order. During deposition, the Ar gas pressure was fixed at 0.6 Pa whereas the power applied to the DC magnetron cathode was changed: 2 kW for CoTaZr and 100 W for Ru.

Then, as an intermediate layer 5, a double-layered structure was formed by sputtering Ta to a thickness of 3 nm and Ru to a thickness of 15 nm in this order. During deposition, the Ar gas pressure was kept at 1 Pa and then 4 Pa.

Figure 1:
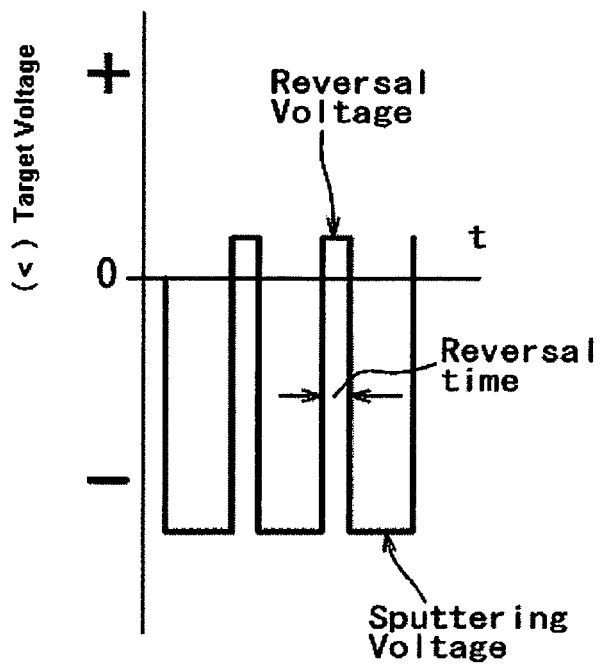
FIG. 1 shows a pulsed voltage applied to a target for a perpendicular magnetic recording layer in an implementation of the present invention.

To form a perpendicular magnetic recording layer 6, DC pulses were used as shown in FIG. 1. The Ar gas pressure was kept at 3 Pa. The applied DC power was 250 W, 500 W or 1 kW. During the reversal period (Reversal Time) between sputtering periods, a plus voltage (Reversal Voltage) was applied. The target used was composed of CoCrPt mixed with $SiO_2$. Listed in Table 1 are test samples which were prepared under respective conditions by this manufacturing method. Comparison samples are listed there as well.

TABLE 1

| Test Samples | DC-Power (KW) | Frequency (KHz) | Reversal Time (μ sec) | Reversal Voltage (V) | Film Thickness (nm) | Hc (KA/m) | Glide Yield (%) | RW-BER |
|---|---|---|---|---|---|---|---|---|
| 1 | 250 | 150 | 3.8 | 20 | 16 | 520 | 92 | 4.00E−06 |
| 2 | 500 | 150 | 3.8 | 32 | 16 | 528 | 95 | 3.80E−06 |
| 3 | 1000 | 150 | 3.8 | 40 | 16 | 528 | 98 | 2.80E−06 |
| 4 | 500 | 100 | 4.5 | 33 | 16 | 520 | 93 | 5.00E−06 |
| 5 | 500 | 50 | 7 | 33 | 16 | 520 | 96 | 4.00E−06 |

| Comparison Sample | DC-Power (KW) | Film Thickness (nm) | Hc (KA/m) | Glide Yield (%) | R/W-BER |
|---|---|---|---|---|---|
| 1 | 150 | 16 | 504 | 65 | 3.00E−04 |
| 2 | 500 | 16 | 480 | 72 | 2.50E−04 |

Figure 3:
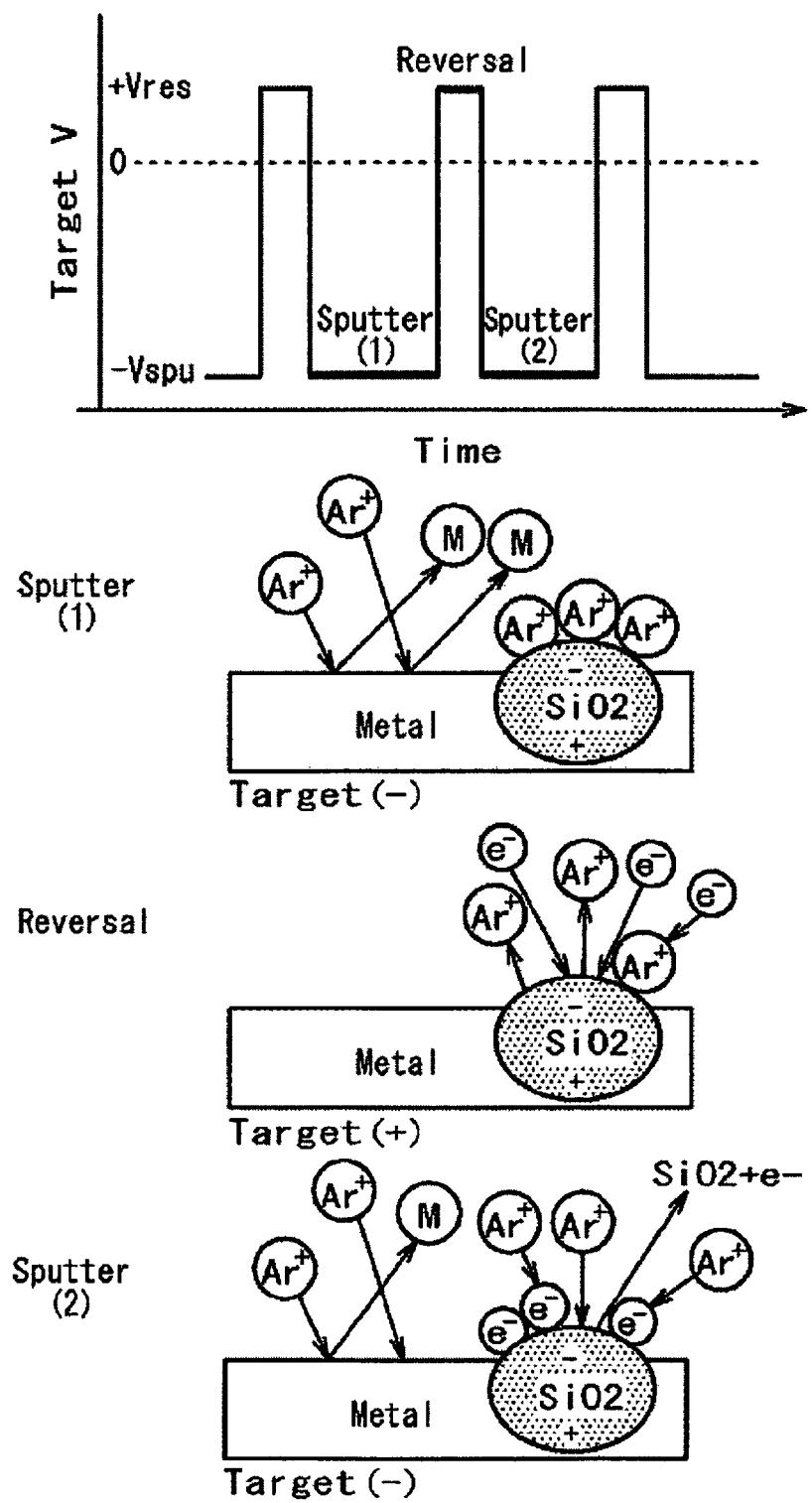
FIG. 3 is provided to explain DC pulse sputtering by an implementation of the present invention.

FIG. 3 shows the process of sputtering. During sputtering (Sputtering (1)), a negative voltage is applied to the target. This biases the target surface to a negative potential, causing Ar+ to collide with and sputter CoCrPt and $SiO_2$ for deposition on the intermediate layer 5. The top surface of the insulation material ($SiO_2$) on the target is charged by Ar+ to have a voltage larger than the target voltage. If nothing is done, the insulation material may have insulation breakdown which causes large arcing. According to this implementation of the present invention, arcing can be prevented since the charge on the surface of the insulation material is neutralized due to a positive voltage applied to the target during the non-sputtering period (Reversal).

After the perpendicular magnetic recording layer 6 was formed, a protective layer 7 was formed by the RF-CVD method. During deposition, the pressure was kept at 2.2 Pa. Ethylene mixed with hydrogen at 20% and nitrogen at 2% was used to deposit a DLC film to a thickness of 5 nm.

On the top of the protective layer 7, a lubricant layer 8 is formed by coating a fluorine-based liquid lubricant thereon by dip coating.

Figure 4:
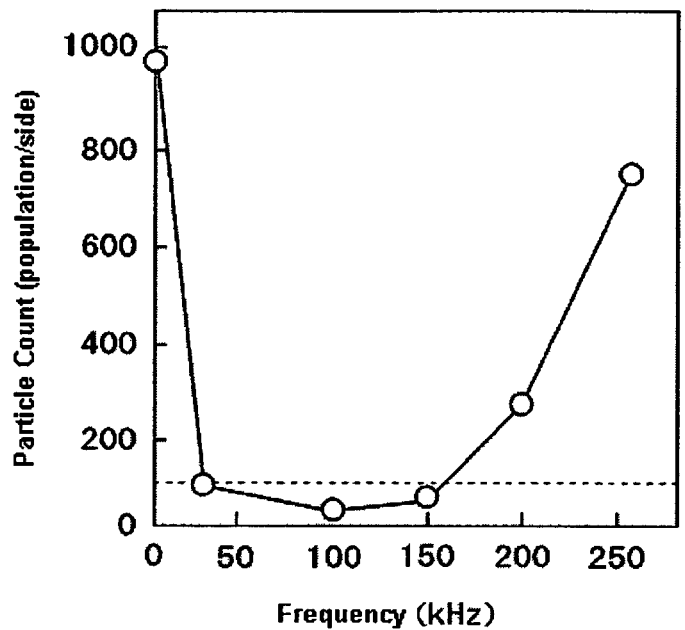
FIG. 4 shows the dependence of particles on the DC pulse frequency.

FIG. 4 shows the relation between the number of particles and the DC pulse frequency. If the DC pulse frequency is in the range of about 20 kHz to 150 kHz, the particle count per magnetic disk surface is not higher than 100.

Figure 5:
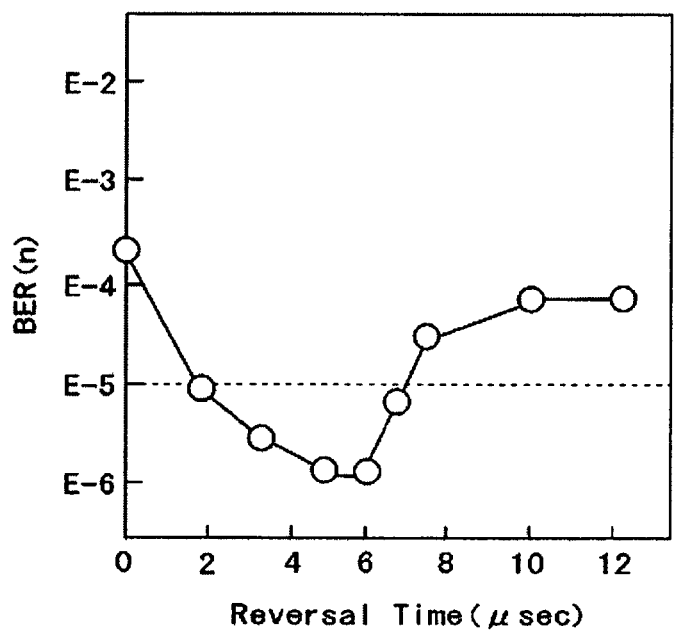
FIG. 5 shows the dependence of the BER on the DC pulse reversal period.

FIG. 5 shows the relation between the reversal time and the bit error rate (BER). If the reversal time is in the range of about 2 μsec to 7 μsec, the BER is not higher than $5\times10^{-6}$.

Figure 6:
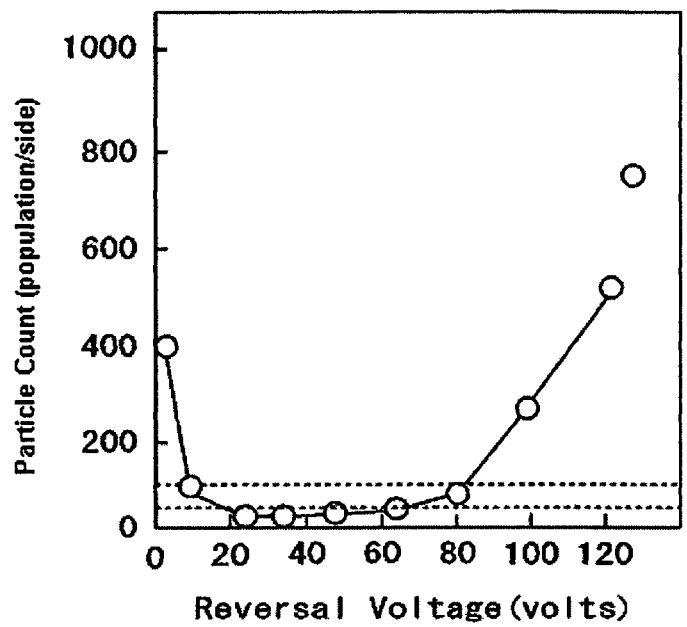
FIG. 6 shows the dependence of particles on the DC pulse reversal voltage.

FIG. 6 shows the relation between the voltage (Reversal Voltage) applied to the target during the reversal time and the number of particles. If the applied voltage is in the range of about +15 V to +70 V, the particle count per magnetic disk surface is not higher than 100.

Figure 7:
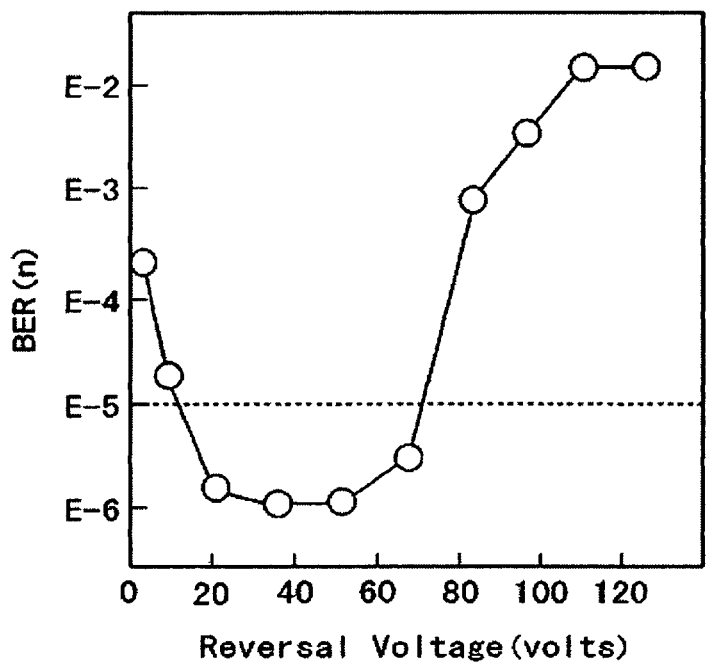
FIG. 7 shows the dependence of the BER on the DC pulse reversal voltage.

FIG. 7 shows the relation between the voltage (Reversal Voltage) applied to the target during the reversal time and the BER. If the applied voltage is in the range of about +15 V to +70 V, the BER is not higher than $5\times10^{-6}$.

Figure 8:
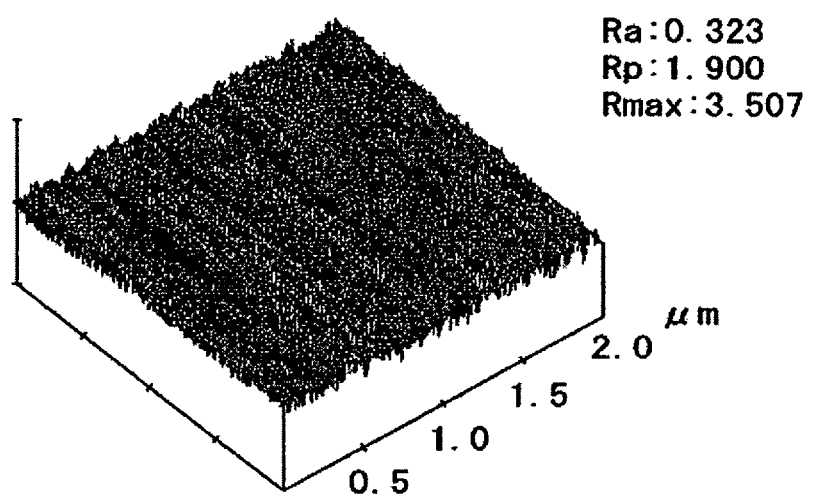
FIG. 8 shows an AFM image and roughness values of the surface of a film fabricated by a manufacturing method implementation of the present invention.
Figure 9:
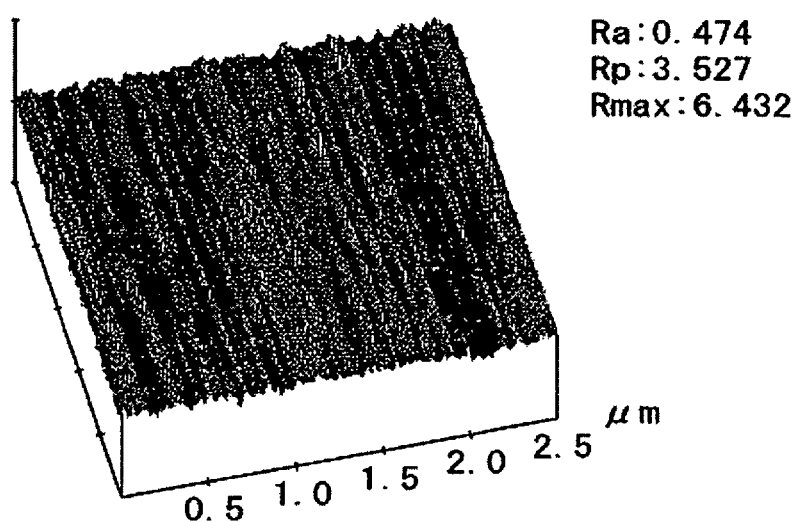
FIG. 9 shows an AFM image and roughness values of the surface of a film fabricated by conventional DC sputtering.

FIG. 8 shows the surface of a perpendicular magnetic recording disk obtained by this manufacturing method, according to an implementation of the present invention. This image is depicted by measuring the surface with an AFM (Atomic Force Microscope). Due to the decreased particles scattered from the target during deposition of the perpendicular magnetic recording layer 7, the surface roughness of the protective layer 7 formed on the perpendicular magnetic recording layer 6 is improved: central average roughness Ra 0.323 nm, central peak Rp 1.9 nm and maximum peak 3.507 nm. Accordingly, 92% passed a flying performance check as shown in Table 1. For comparison, FIG. 9 shows an AFM image of the surface of a protective layer under which a perpendicular magnetic recording layer was formed by conventional DC sputtering. Its surface roughness is: central average roughness Ra 0.474 nm, central peak Rp 3.527 nm and maximum peak 6.432 nm. In this case, at most 72% passed the flying performance check as shown in Table 1.

These results indicate that applying a plus voltage to the target at reversal time in DC pulse sputtering contributes to the improved surface roughness and flying performance check pass ratio and this is attributable to the effect of Ar+ striking the substrate surface which is relatively set to a minus potential through electric interaction in the total system due to the plus voltage applied to the target. In addition, since particles due to arcing are eliminated, errors are reduced, resulting in improvement in the BER.

As described so far, according to the above-mentioned manufacturing method implementation of the present invention, it is possible to manufacture high quality perpendicular magnetic recording disks with high yields since particles sticking to the magnetic disk surfaces can be so decreased as to improve the BER.

Figure 10:
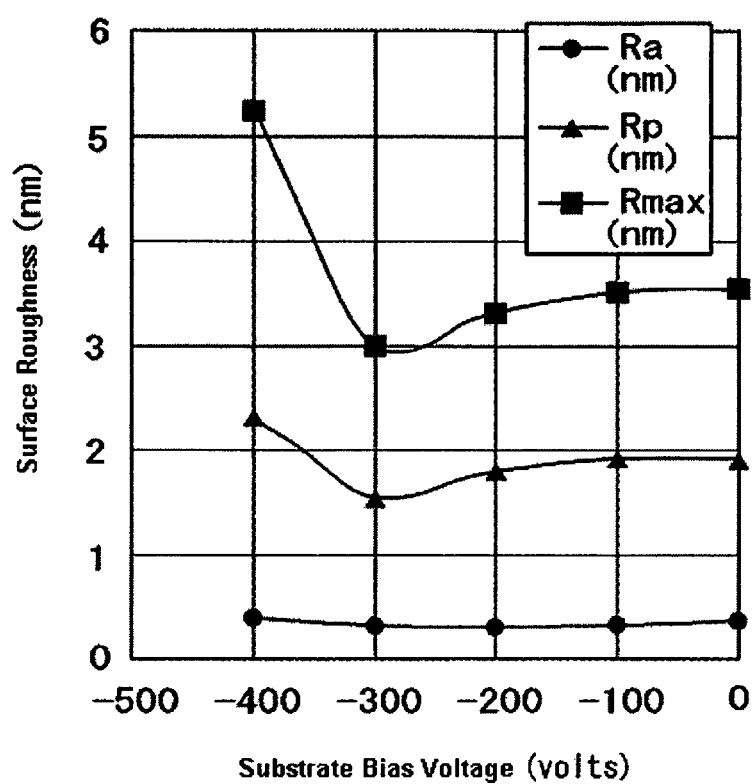
FIG. 10 shows the surface roughness of a film fabricated by another implementation of the present invention.

The following describes another manufacturing method implementation to further improve properties of the perpendicular magnetic recording medium. This method is basically same as the above-mentioned implementation but differs in that a bias voltage is applied to the substrate 1 during formation of the perpendicular magnetic recording layer 6. With DC pulses applied to the target (frequency 100 kHz, reversal period (Reversal Time) 4.5 μsec), −100 V, −200 V, −300 V or −400 V is applied as a DC bias to the substrate during sputtering. Table 2 and FIG. 10 show this result. A comparison sample shown there was prepared by conventional DC sputtering.

TABLE 2

| Test Sample | Bias Voltage (Volts) | Coercivity (KA/m) | Flying Check Passed (%) | R/W-BER |
|---|---|---|---|---|
| 6 | 0 | 520 | 92 | 4.00E−06 |
| 7 | −100 | 524 | 93 | 3.42E−06 |
| 8 | −200 | 536 | 96 | 1.07E−06 |
| 9 | −300 | 552 | 97 | 1.22E−06 |
| 10 | −400 | 560 | 85 | 8.60E−05 |
| Comparison Sample 3 | Not Pulsed/Biased | 480 | 72 | 2.50E−04 |

As shown in Table 2, applying a bias voltage to the substrate improves the flying check pass ratio and BER as well as the magnetic property. That is, by applying a bias voltage, the surface roughness is greatly suppressed as shown in FIG. 10, the flying performance is improved. In addition, combined with DC pulses, the substrate bias brings about further error reduction effect in the BER. Accordingly, combining DC pulses with a substrate bias allows further yield improvement. Similar effect can also be obtained by another biasing method such as DC bias, DC pulsed, RF or the like.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A method for manufacturing a perpendicular magnetic recording medium, comprising:
    preparing a substrate;
    forming an adhesion layer, a magnetic domain pinning layer, a soft magnetic under layer and an intermediate layer on the substrate;
    forming a perpendicular magnetic recording layer on the intermediate layer by performing DC pulse sputtering, wherein a negative voltage is applied to a target made of magnetic material mixed with insulation material during a sputtering period and a positive voltage is applied to the target during a non-sputtering period, the negative voltage causing Ar+ to collide with and sputter the magnetic material and the insulation material for deposition on the intermediate layer;
    forming a protective layer on the perpendicular magnetic recording layer; and
    forming a lubricant layer on the protective layer.

2. A method for manufacturing a perpendicular magnetic recording medium according to claim 1, wherein the DC pulse sputtering is such that the DC pulse frequency is about 20 kHz to 150 kHz.

3. A method for manufacturing a perpendicular magnetic recording medium according to claim 1, wherein the DC pulse sputtering is such that the positive voltage applied to the target during the non-sputtering period is about +15 V to +70 V.

4. A method for manufacturing a perpendicular magnetic recording medium according to claim 1, wherein the target is made of CoCrPt alloy mixed with $SiO_2$.

5. A method for manufacturing a perpendicular magnetic recording medium according to claim 1, wherein the substrate is a glass substrate, a ceramic substrate or an aluminum substrate plated with NiP.

6. A method for manufacturing a perpendicular magnetic recording medium according to claim 1, wherein the adhesion layer, the magnetic domain pinning layer, the soft magnetic under layer and the intermediate layer are formed by DC sputtering.

7. A method for manufacturing a perpendicular magnetic recording medium according to claim 1, wherein the magnetic domain pinning layer is formed by laminating a crystallographic orientation control layer, an anti-ferromagnetic layer and a magnetic domain pinning enhance layer in order.

8. A method for manufacturing a perpendicular magnetic recording medium according to claim 1, wherein the soft magnetic under layer is formed by laminating a high saturation magnetic flux density layer, a nonmagnetic layer and a high saturation magnetic flux density layer.

9. A method for manufacturing a perpendicular magnetic recording medium according to claim 1, wherein the intermediate layer is formed by laminating a precoat layer and a crystallographic orientation control layer.

10. A method for manufacturing a perpendicular magnetic recording medium, comprising:
    preparing a substrate;
    forming an adhesion layer, a magnetic domain pinning layer, a soft magnetic under layer and an intermediate layer on the substrate;
    forming a perpendicular magnetic recording layer on the intermediate layer by performing DC pulse sputtering, wherein a bias voltage is applied to the substrate, a negative voltage is applied to a target made of magnetic material mixed with insulation material during a sputtering period and a positive voltage is applied to the target during a non-sputtering period; the negative voltage causing Ar+ to collide with and sputter the magnetic material and the insulation material for deposition on the intermediate layer;
    forming a protective layer on the perpendicular magnetic recording layer; and
    forming a lubricant layer on the protective layer.

11. A method for manufacturing a perpendicular magnetic recording medium according to claim 10, wherein the DC pulse sputtering is such that the DC pulse frequency is about 20 kHz to 150 kHz.

12. A method for manufacturing a perpendicular magnetic recording medium according to claim 10, wherein the DC pulse sputtering is such that the positive voltage applied to the target during the non-sputtering period is about +15 V to +70 V.

13. A method for manufacturing a perpendicular magnetic recording medium according to claim 10, wherein the target is made of CoCrPt alloy mixed with $SiO_2$.

14. A method for manufacturing a perpendicular magnetic recording medium according to claim 10, wherein the substrate is a glass substrate, a ceramic substrate or an aluminum substrate plated with NiP.

15. A method for manufacturing a perpendicular magnetic recording medium according to claim 10, wherein the adhesion layer, the magnetic domain pinning layer, the soft magnetic under layer and the intermediate layer are formed by DC sputtering.

16. A method for manufacturing a perpendicular magnetic recording medium according to claim 10, wherein the magnetic domain pinning layer is formed by laminating a crystallographic orientation control layer, an anti-ferromagnetic layer and a magnetic domain pinning enhance layer in order.

17. A method for manufacturing a perpendicular magnetic recording medium according to claim 10, wherein the soft magnetic under layer is formed by laminating a high saturation magnetic flux density layer, a nonmagnetic layer and a high saturation magnetic flux density layer.

18. A method for manufacturing a perpendicular magnetic recording medium according to claim 10, wherein the intermediate layer is formed by laminating a precoat layer and a crystallographic orientation control layer.

19. A method for manufacturing a perpendicular magnetic recording medium according to claim 1,
    wherein the DC pulse sputtering is such that the positive voltage applied to the target during the non-sputtering period is about +15 V to +70 V,
    wherein the target is made of CoCrPt alloy mixed with $SiO_2$,
    wherein the magnetic domain pinning layer is formed by laminating a crystallographic orientation control layer, an anti-ferromagnetic layer and a magnetic domain pinning enhance layer in order,
    wherein the soft magnetic under layer is formed by laminating a high saturation magnetic flux density layer, a nonmagnetic layer and a high saturation magnetic flux density layer, and wherein the intermediate layer is formed by laminating a precoat layer and a crystallographic orientation control layer.

20. A method for manufacturing a perpendicular magnetic recording medium according to claim 10,
wherein the DC pulse sputtering is such that the positive voltage applied to the target during the non-sputtering period is about +15 V to +70 V,
wherein the target is made of CoCrPt alloy mixed with $SiO_2$,
wherein the magnetic domain pinning layer is formed by laminating a crystallographic orientation control layer, an anti-ferromagnetic layer and a magnetic domain pinning enhance layer in order,
wherein the soft magnetic under layer is formed by laminating a high saturation magnetic flux density layer, a nonmagnetic layer and a high saturation magnetic flux density layer, and
wherein the intermediate layer is formed by laminating a precoat layer and a crystallographic orientation control layer.

* * * * *